United States Patent

Yumoto

[11] Patent Number: 6,036,901
[45] Date of Patent: Mar. 14, 2000

[54] PROCESS FOR PRODUCING ELECTRONIC PARTS

[75] Inventor: Tetsuo Yumoto, Saitama, Japan

[73] Assignee: Sankyo Kasei Kabushiki Kaisha, Tokyo, Japan

[*] Notice: This patent is subject to a terminal disclaimer.

[21] Appl. No.: 08/992,540

[22] Filed: Dec. 17, 1997

[30] Foreign Application Priority Data

Dec. 24, 1996 [JP] Japan ................... 8-355428

[51] Int. Cl.$^7$ ............ B29C 33/52; B29C 59/00
[52] U.S. Cl. ............... 264/129; 264/221; 264/317; 264/DIG. 44
[58] Field of Search .................. 264/129, 221, 264/317, DIG. 44, 264, 135, 139; 249/62; 427/304–307; 438/694, 703, 964, 763

[56] References Cited

U.S. PATENT DOCUMENTS

| 3,882,220 | 5/1975 | Ryder .................. 264/221 |
| 4,812,275 | 3/1989 | Yumoto ................. 264/129 |
| 4,812,353 | 3/1989 | Yumoto ................. 428/172 |
| 4,997,724 | 3/1991 | Suzuki et al. ........... 428/626 |
| 5,217,571 | 6/1993 | Rosenau et al. .......... 156/668 |

Primary Examiner—Jan H. Silbaugh
Assistant Examiner—Suzanne E. Mason
Attorney, Agent, or Firm—Foley & Lardner

[57] ABSTRACT

An electronic part having a complicated internal configuration is integrally molded without dividing the configuration into a plurality of sections, thereby reducing the cost and improving the quality of the electronic part. The manufacturing process comprises producing a core to be used in the subsequent injection molding, which corresponds to the complicated internal configuration of the electronic part, by the injection molding of a polyvinyl alcohol-based resin containing an oxyalkylene group, producing a second stage product which has the core inserted therein and which has a ridgy projection as a circuit pattern forming area on the surface thereof by the injection molding of a metallization-grade aromatic polyester liquid crystalline polymer, immersing the second stage product in hot water under heating so as to dissolve the core away in hot water, roughening the surface of the second stage product and then providing a catalyst thereto so as to produce a third stage product, inserting the third stage product into a mold cavity and then injecting a nonmetallization-grade liquid crystalline polymer into the mold cavity encircling the third stage product by injection molding so that the surface excluding the ridgy projection as a circuit pattern forming area is coated with the liquid crystalline polymer so as to obtain a fourth stage product, and finally metallizing the surface of the circuit pattern forming area exposed on the external peripheral surface of the fourth stage product so as to form an electrically conductive circuit.

5 Claims, 5 Drawing Sheets

PROCESS FOR PRODUCING ELECTRONIC PARTS

BACKGROUND OF THE INVENTION

The present invention relates to a process for producing electronic parts, which are made from a synthetic resin and have an elaborate and complicated internal configuration, such as external bottom cases for connectors, switches, portable telephones, video cameras, and the like, and also relates to electronic parts produced thereby.

DESCRIPTION OF THE RELATED ART

A conventional process for producing an electronic part, which is made from a synthetic resin and has an elaborate and complicated internal configuration, comprises producing a plurality of separate sections of an electronic part having different configurations by injection molding and joining the predetermined surfaces of these sections by means of heat or high-frequency wave to form an electronic part as a final product.

However, the above-described conventional process has following disadvantages: different molds are required for each section of the electronic part, which increases the production cost of molds as well as the number of production steps; the number of steps for joining the plurality of different sections increases, which is troublesome; and inferior strength at the joining surfaces between the sections makes it difficult to produce an electronic part having a uniform strength as a whole.

SUMMARY OF THE INVENTION

An object of the present invention is to solve the above-described problems and to provide a process for producing a high-quality electronic part, even if the part has an elaborate and complicated internal configuration, by means of an integral injection molding operation without dividing the configuration into a plurality of sections so as to adopt a smaller number of molds and steps, thereby significantly reducing the production cost, and to eliminate the junctions of the sections so that the superior electronic part can be produced, and an electronic part produced thereby.

Another object of the present invention is to facilitate the production of a electronic part by comprising a resinous material of a core for the injection molding process which can be easily dissolved in hot water and has biodegradability so as to be returned to nature without polluting the environment.

Still another object of the present invention is to produce an injection-molded article having a complicated internal configuration with precision by comprising, for the material of the electronic part as a final product, a material which can be molded without melting the core for injection molding so as to exhibit an excellent release from the core without forming observable burrs.

Still a further object of the present invention is to securely dissolve away the core for injection molding and to perform heat treatment at the circuit forming stage, by comprising a material which is excellent in heat resistance for an electronic part.

Still a further object of the present invention is to easily form a circuit exclusively on the desired site.

Still a further object of the present invention is to provide an electronic part at low cost which has an elaborate and complicated internal configuration with superior quality and high reliability by means of the above-described process.

The production process according to the present invention comprises a first molding step for producing a core to be used in the subsequent injection molding step, a second molding step for producing a second stage product having the core inserted therein, a dissolution step for dissolving away the core from the second stage, a catalyst providing step for providing a catalyst to a third stage product after the core is dissolved away, a third molding step for producing a fourth stage product by injecting a liquid crystalline polymer, and a circuit pattern forming step for forming a circuit pattern at a predetermined site of the fourth stage product.

At the first molding step, a core to be used in the injection molding is produced by injection-molding a resin, such as a polyvinyl alcohol-based resin containing an oxyalkylene group, which is water soluble and has a melting point lower than that of the second stage product to be produced at the second molding step.

At the second molding step, a second stage product, which has the core inserted therein and has a ridgy projection as a circuit pattern forming area on the surface thereof, is produced by injecting a metallization-grade aromatic polyester liquid crystalline polymer (hereinafter referred to as a liquid crystalline polymer). At this step, it is important that the core for the injection molding be not dissolved.

At the dissolution step, the second stage product is heated in hot water so as to dissolve away the core in hot water. At the catalyst providing step, the third stage product, which is obtained by dissolving away the core in hot water, is surface-roughened and then provided with a catalyst. Then, at the third molding step, the third stage product, which has the core dissolved away, is inserted into a mold cavity and a fourth stage product is produced by injecting a nonmetallization-grade liquid crystalline polymer into the mold cavity so as to coat the entire surface excluding the ridgy projection as a circuit pattern forming area. Finally, at the circuit pattern forming step, the surface of the circuit pattern forming area which is exposed on the fourth stage product is metallized so as to form an electrically conductive circuit.

It was predicted that the utilization of the liquid crystalline polymer at the above-described second molding step might inhibit the present invention from being put to practical use due to the following reasons. That is, since the liquid crystalline polymer employed at the second molding step for producing the second stage product is injected at a resin temperature in the range of 290 to 350-C., which is far higher than the melting point, i.e., a temperature in the range of 190 to 200-C., of the polyvinyl alcohol-based resin as a material for the core produced at the first molding step, the surface of the core is melted, deformed, or fused intermixed with the liquid crystalline polymer, and therefore a precisely molded product as the second stage product may not be obtained.

On the contrary, however, the various experiments performed by the present inventors showed that the core for injection molding did not deform, or melt into the second molded product or adhere thereto by fusing, thereby proving the method to be well practicable. It is presumed that this advantageous result is due to the specific interaction occurred by combination of the following features: the liquid crystalline polymer exhibits a crystalline property even in a molten state, and exhibits a molecular structure which is elongated in the flow direction at the time of molding; the surface of the crystalline polymer has a peculiar structure called a skin layer; and the injection-packing of the liquid crystalline polymer into the mold cavity can be performed very rapidly because of rapid solidification property by cooling and high fluidity, compared to common resins.

The present inventors aimed at this point and utilized at the second molding step the liquid crystalline polymer. The crystalline polymer is highly desirable in that a precisely molded product can be produced without melting or deforming the inserted core, and that the skin layer provides an excellent release from the core at the dissolution step where the inserted core is dissolved away after the second molding step.

The electronic part produced by the above-described process is of high quality having an electroconductive circuit formed on the surface thereof and a complicated internal configuration by producing integrally, and an electronic device can be easily mounted on the circuit by means of soldering.

BRIEF DESCRIPTION OF THE DRAWINGS

FIG. 1 shows a core for injection molding which is produced at the first molding step of the production process according to the present invention, wherein

FIG. 2 shows a second stage product at the second molding step which has the core inserted therein, wherein

FIG. 3 shows a third stage product after the dissolution step, wherein

FIG. 4 shows a fourth stage product, wherein

FIG. 5 shows an electronic part as a final product, wherein

DETAILED DESCRIPTION OF PREFERRED EMBODIMENTS

Figure 1A:
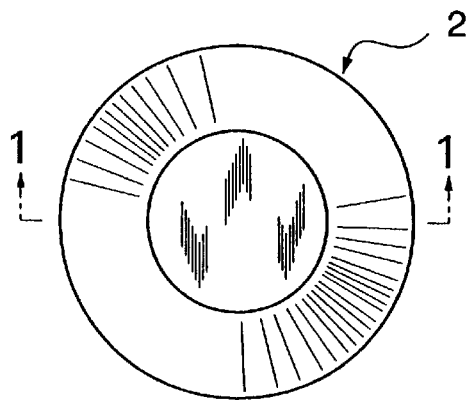
FIG. 1A is a top view.
Figure 1B:
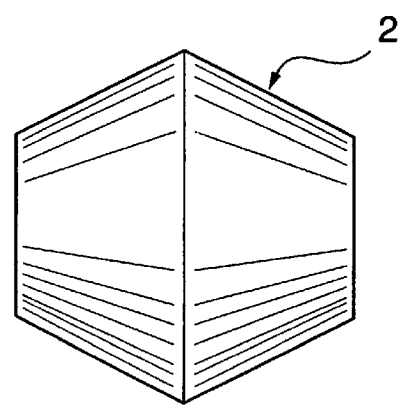
FIG. 1B is a side view.
Figure 1C:
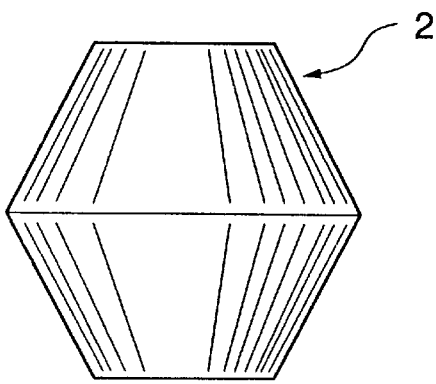
FIG. 1C is a front view.
Figure 1D:
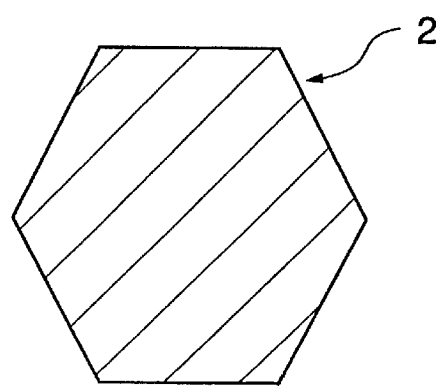
FIG. 1D is a cross-sectional view taken along the line 1—1.

Referring to the drawings, the present invention is now explained in detail hereinafter so that the salient features will become more apparent.

Figure 5A:
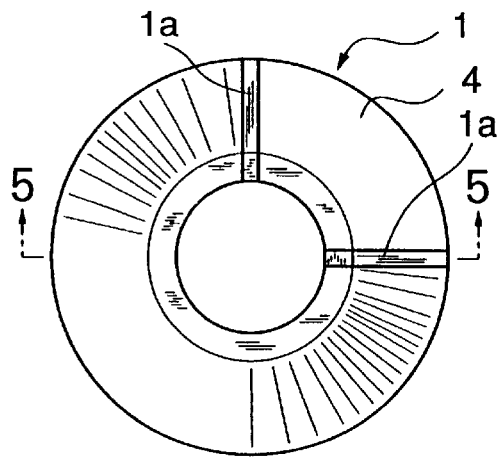
FIG. 5A is a top view.
Figure 5B:
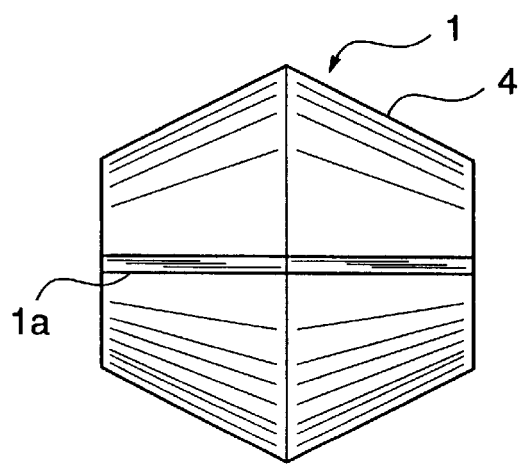
FIG. 5B is a side view.
Figure 5C:
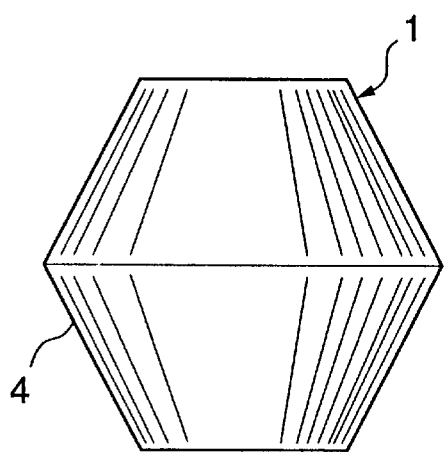
FIG. 5C is a front view.
Figure 5D:
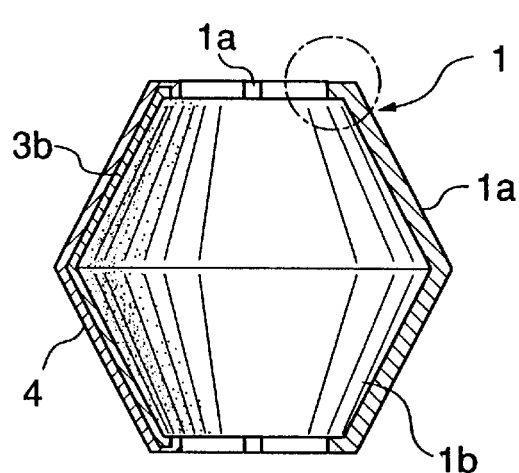
FIG. 5D is a cross-sectional view taken along the line 5—5.
Figure 5E:
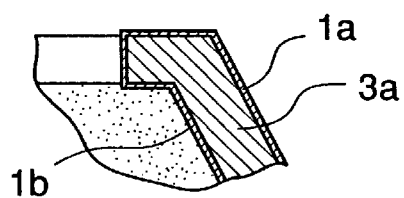
FIG. 5E is a partial enlarged sectional view of FIG. 5D.

(a) FIG. 1 shows a core 2 which is produced at the first molding step and the external configuration of the core 2 corresponds to the internal configuration (see FIG. 5D) of the hollow portion to be formed in an electronic part 1 as a final product. As shown in FIGS. 1A, 1B, 1C, and 1D, the external configuration of the core 2 has a largest diameter in the middle and flat circular upper and lower surfaces. The core 2 is produced by injecting a water-soluble resin at a predetermined injection pressure into the mold cavity created by the opposed surfaces of ordinary upper and lower mold units (not shown). Since the core 2 is to be dissolved away in hot water after the second molding step, as described later, the resin material constituting the core is required to have a melting point lower than that of the plastic material constituting the electronic parts and to have a solubility in water so as to be easily dissolved in hot water.

The polyvinyl alcohol-based resin containing an oxyalkylene group used in the Examples such as "ECOMATY AX" produced by Nippon Synthetic Chemical Industry Co., Ltd. is suitable for the injection molding operation because of excellent melt-moldability, and suitable for the dissolution step because of the melting point in the range of 190 to 200-C. and solubility in water. Moreover, this resin is desirable since it can be returned to nature without polluting the environment because of the biodegradability.

An example of injection molding at this step is given below.

Injection material: "ECOMATY AX"
Cylinder temperature: 210-C.
Mold temperature: 25-C.
Injection pressure: 900 Kg/cm2
Cooling time: 20 seconds (b) At the second molding step, as shown in FIG. 2, a second stage product 3 which has the core 2 inserted therein is produced. The internal configuration of mold cavity, which is created by the opposed surfaces of ordinary upper and lower mold units (not shown) and which is used for the production of the second stage product 3, corresponds to the external configuration having a ridgy projection for a circuit pattern 1a (see FIGS. 5A and 5D) to be formed on the surface of an electronic part 1. The second stage product 3 is produced by inserting the core 2 into the mold cavity and then injecting a metallization-grade liquid crystalline polymer, e.g., an aromatic polyester liquid crystalline polymer, at a predetermined pressure into the cavity surrounding the core 2 by injection molding. Examples of the aromatic polyester liquid crystalline polymer include "VECTRA" METALLIZATION-GRADE C810 produced by Polyplastics Co., Ltd..

It is imperative that the second stage product 3, which has the core 2 inserted therein, be produced by injection molding without melting the core. In addition, the material of electronic parts is required to withstand the heat of soldering and reflow of solder. Since the electronic parts are generally exposed to an atmosphere of 240 to 280-C. for 10 to 30 seconds, an aromatic polyester liquid crystalline polymer is often utilized as a thermoplastic resin which withstands such a condition.

Figure 2A:
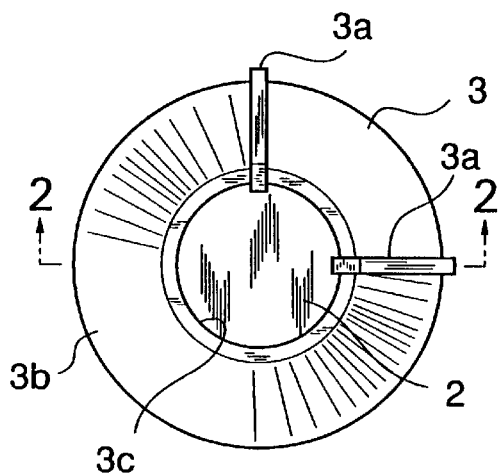
FIG.2A is a top view.
Figure 2B:
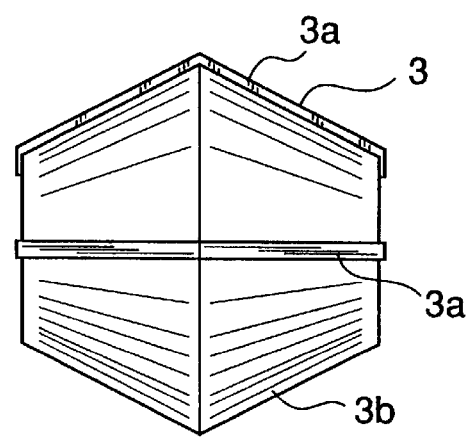
FIG. 2B is a side view.
Figure 2C:
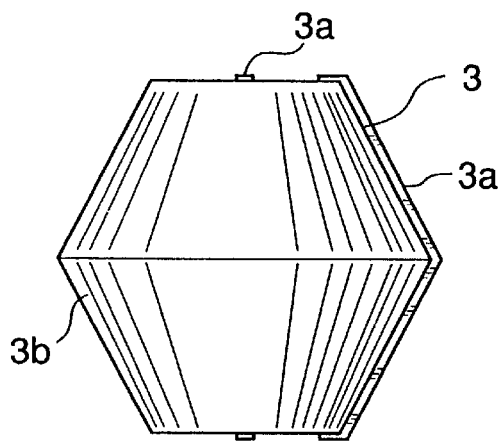
FIG. 2C is a front view.
Figure 2D:
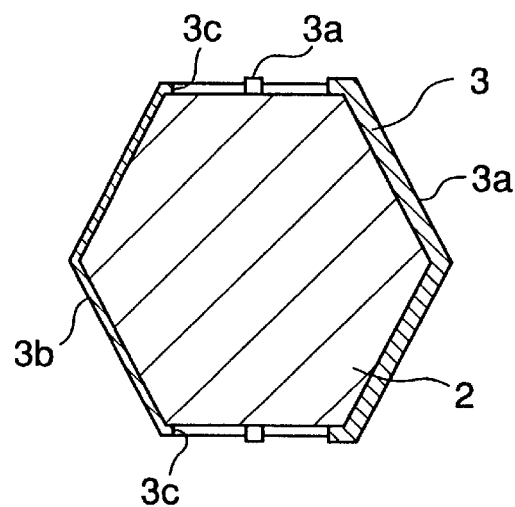
FIG. 2D is a cross-sectional view taken along the line 2—2.

As shown in FIGS. 2A, 2B, and 2C, the second stage product 3 has two ridges indicated by 3a which are designed for use in the formation of circuit pattern and continue from top surface to the bottom surface on the external surface so the external surface 3b excluding the ridges has a thin wall. As shown in FIG. 2D, the circular upper and lower surfaces each have an opening 3c serving as a discharge outlet at which the inserted core 2 is exposed.

An example of injection molding at this step is a temperature in the range of 50 to 90-C. An example of the catalyst providing process comprises immersing the third stage product 30 in a catalyst solution containing a mixture of tin and palladium catalysts and thereafter activating the catalysts using an acid such as hydrochloric acid or sulfuric acid so that palladium is deposited on the surface of the third stage product 30. Alternatively, a relatively strong reducing agent such as tin (I) chloride is adsorbed on the surface of the third stage product 30 and thereafter the third stage product 30 is immersed in a catalyst solution containing precious metal ions such as gold so that gold is deposited on the surface thereof. As a result of this treating step, a catalyst is provided not only to the external surface including the ridge 3a and the external surface 3b excluding the ridge of the third stage product 30 but also to the internal peripheral surface 3d. That is, owing to this treatment, the surface on which a circuit pattern is to be produced by a subsequent treatment becomes ready for metallization as well as the other surface is also roughened to receive the catalyst, thereby enabling bonding with a liquid crystalline polymer of the subsequent third molding step.

(e) The third molding step is explained hereinafter. FIG. 4 shows a fourth stage product 4 which has the third stage product 30 inserted therein after receiving the catalyst, which is produced by the third molding step. The fourth stage product 4 is required to be produced so that the surface of the ridge 3a on the third stage product 30 on which a circuit pattern is to be formed by a subsequent treatment is exposed to be metallized, whereas the other surface is incapable of being metallized. Thus, the third molding step comprises coating a nonmetallization-grade liquid crystalline polymer (e.g., "VECTRA D130Mi") by injection molding onto the surface of the third stage product 30 excluding the surface (i.e., the surface of the ridge 3a) which is to be exposed to be given below.

Figure 3A:
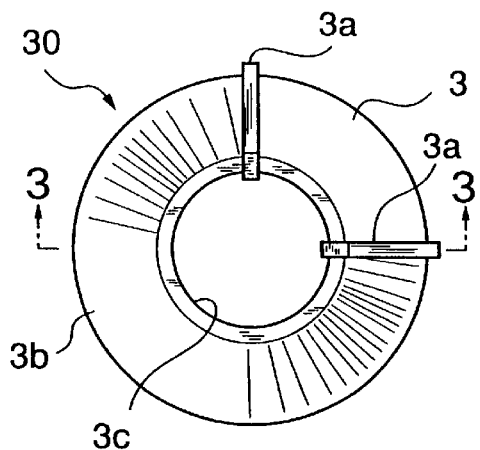
FIG. 3A is a top view.
Figure 3B:
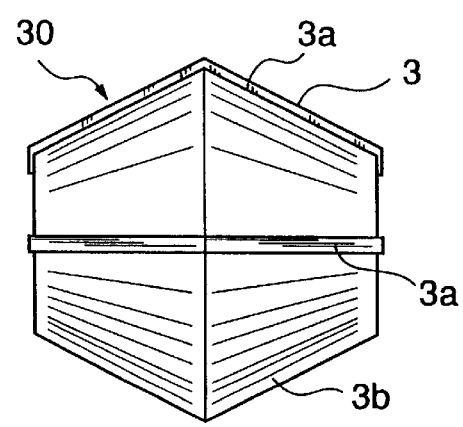
FIG. 3B is a side view.
Figure 3C:
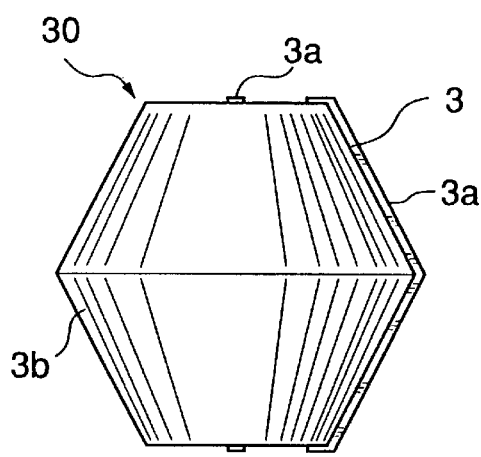
FIG. 3C is a front view.
Figure 3D:
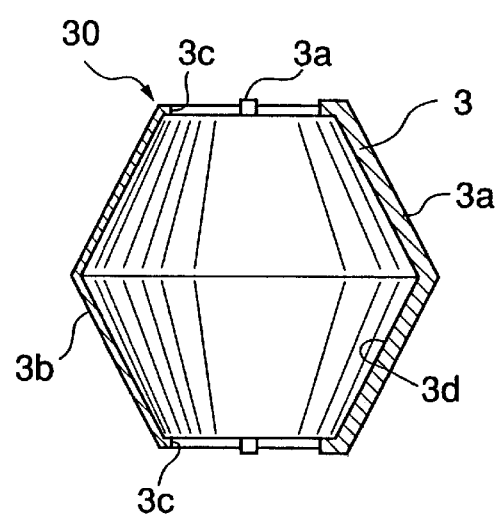
FIG. 3D is a cross-sectional view taken along the line 3—3.

Injection material: "VECTRA" METALLIZATION-GRADE C810
Cylinder temperature: 320-C.
Mold temperature: 110-C.
Injection pressure: 1,200 Kg/cm2
Cooling time: 15 seconds (c) Next, the dissolution step for dissolving away the core 2 is explained with reference to FIGS. 3A–3D. The second stage product 3, which is produced at the second molding step, is placed in hot water and is heated to a temperature in the range of 80 to 100-C. Since the above-mentioned liquid crystalline polymer "VECTRA" has a thermal deformation temperature of 200-C. or greater, the liquid crystalline polymer "VECTRA" constituting the second stage product 3 undergoes no change although the core made from "ECOMATY AX" is dissolved away in hot water by heating it to a temperature in the range of 80 to 100-C. Accordingly, as shown in FIG. 3D, the core 2 having a largest diameter in the middle thereof is dissolved away, and a third stage product 30 is produced which is hollow inside and has an internal peripheral surface 3d continuing to each of the openings 3c. Since the dissolution step is carried out in hot water as described above, the dissolution is easily carried out. Moreover, "ECOMATY AX" is highly desirable in that it can be returned to nature without polluting the environment because of the biodegradability.

(d) Next, the step for providing a catalyst to the surface of the third stage product 30 of FIG. 3(d) is explained. The third stage product 30 is degreased and then is subjected to a surface-roughening (etching) treatment, followed by a catalyst receiving treatment. For example, the etching is carried out by immersing the third stage product 30 for a predetermined period of time in an alkaline aqueous solution which contains sodium hydroxide or potassium hydroxide dissolved at a predetermined concentration at a predetermined temperature, for example, metallized. As described above, since the skin layer is formed on the surface of a liquid crystalline polymer, even two of the liquid crystalline polymers are incompatible with each other. However, it is possible to integrate the above-mentioned two liquid crystalline polymers owing to the above-described step comprising etching followed by the catalyst providing step.

Accordingly, the fourth stage product 4 is produced by a process comprising creating a mold cavity corresponding to the external configuration of an electronic part 1, inserting the third stage product 30 into the mold cavity, and then injecting "VECTRA D130Mi" at a predetermined pressure into the cavity encircling the third stage product 30 by injection molding.

Figure 4A:
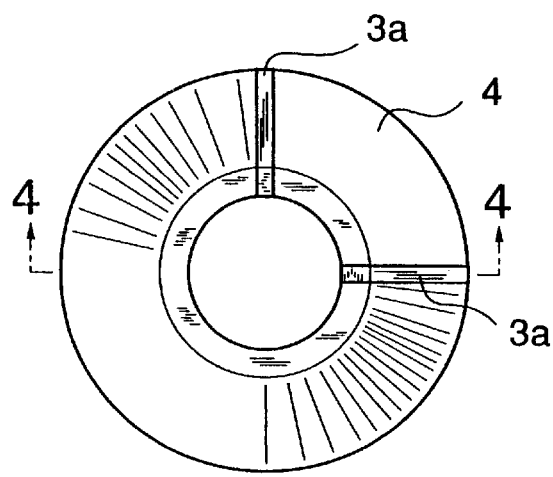
FIG. 4A is a top view.
Figure 4B:
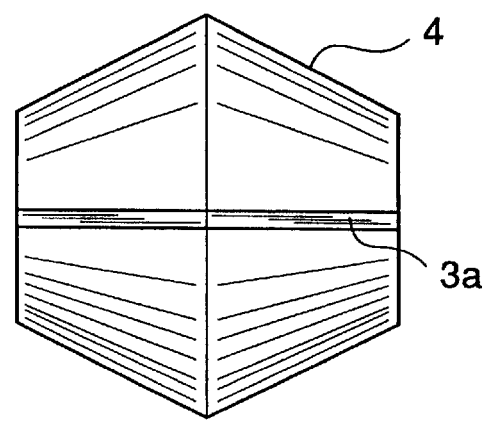
FIG. 4B is a side view.
Figure 4C:
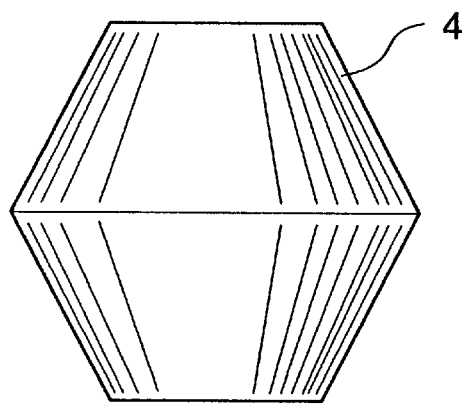
FIG. 4C is a front view.
Figure 4D:
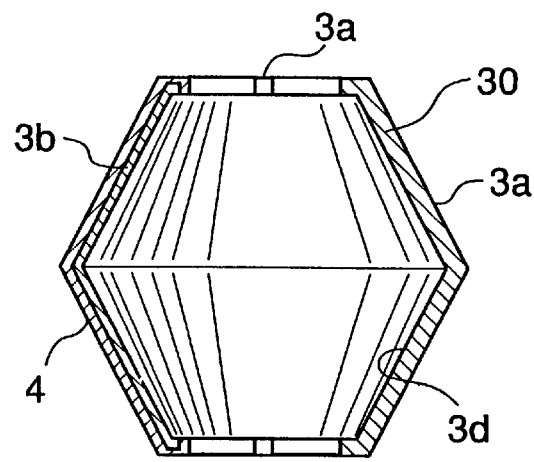
FIG. 4D is a cross-sectional view taken along the line 4—4.

As shown in FIGS. 4A, 4B, and 4C, the fourth stage product 4 has a configuration wherein two ridges 3a consisting of metallization-grade liquid crystalline polymer which are provided with the catalyst for forming a circuit pattern and are exposed continuously from top surface to the bottom surface on the external surface, and the other surface of the external surface 3b has the nonmetallization-grade liquid crystalline polymer laminated thereon so that the ridges 3a which are provided with the catalyst are exposed at the same surface level without protruding therefrom.

An example of injection molding at this step is given below.

Injection material: "VECTRA D130Mi"
Cylinder temperature: 300-C.
Mold temperature: 100-C.
Injection pressure: 600 Kg/cm2
Cooling time: 15 seconds (f) FIG. 5 shows an electronic part 1 as the final product which has an electroconductive circuit formed on the surface of the fourth stage product 4. An example of forming the electroconductive circuit comprises chemically depositing a copper layer or a nickel layer on the surface, which has been exposed and provided with the catalyst on which the electroconductive circuit is to be formed at the above-described catalyst providing step and the third molding step. Thus, a circuit pattern 1a is formed as a result of the metallization of the circuit pattern forming area 3a, and the internal peripheral surface 3d is simultaneously metallized to form an electroconductive layer 1b. However, the other surface which is made up of the nonmetallization-grade liquid crystalline polymer is not metallized.

Since both of the metallization-grade liquid crystalline polymer and the nonmetallization-grade liquid crystalline polymer have a high thermal deformation temperature, these polymers can pass through an oven maintained at a high temperature without being damaged. Finally, the molded article is subjected to a heat treatment for removal of water remaining inside the article to finish the electroconductive circuit forming step. Accordingly, an electronic device can be mounted on the circuit by means of soldering.

What is claimed is:

1. A process for producing an electronic part, comprising:
   a first molding step of injecting a melt-moldable, water-soluble resin, soluble in hot water, and which is based on a polyvinyl alcohol resin containing an oxyalkylene group, into a mold cavity corresponding to a complicated internal configuration of the electronic part, to produce a core to be used at a subsequent injection molding step;

a second molding step of inserting said core into a mold cavity corresponding to an external configuration having a ridgy projection for a circuit pattern to be formed on the surface of said electronic part and injecting a metallization-grade aromatic polyester liquid crystalline polymer into said mold cavity by injection molding to produce a second stage product which has said core inserted therein, said circuit pattern forming area protruded as a ridge, and a discharge outlet;

a dissolution step of immersing said second stage product in hot water under heating for dissolving away said core through said discharge outlet;

a catalyst providing step of surface-roughening said third stage product after said dissolution step, and providing a catalyst;

a third molding step of inserting said third stage product, after said catalyst providing step, into a mold cavity corresponding to the external configuration of said electronic part and injecting a nonmetallization-grade liquid crystalline polymer into said mold cavity by injection molding for coating the surface, excluding the circuit pattern forming area, so as to produce a fourth stage product; and an electroconductive circuit forming step of metallizing said circuit pattern forming area exposed at the external peripheral surface of said fourth stage product.

2. A process for producing an electronic part according to claim 1, wherein said core is made from a resin which has a melting point lower than that of said second stage product.

3. A process for producing an electronic part according to claim 1, wherein said core is made from a resin which has a melting point in the range of 190 to 200° C.

4. A process for producing an electronic part according to claim 1, wherein said second stage product is made from said resin which is capable of withstanding the heat of soldering and reflow of solder.

5. A process for producing an electronic part according to claim 1, wherein said second stage product is produced by injection molding without melting said core.

* * * * *